United States Patent
Yamaguchi et al.

[11] Patent Number: 5,649,593
[45] Date of Patent: Jul. 22, 1997

[54] RADIATOR MEMBER

[75] Inventors: Akio Yamaguchi, Kasugai; Asaharu Nakagawa, Yokkaichi, both of Japan

[73] Assignee: Kitagawa Industries Co., Ltd., Nagoya, Japan

[21] Appl. No.: 586,327

[22] Filed: Jan. 17, 1996

[51] Int. Cl.[6] .............................. H05K 7/20; H01L 23/36
[52] U.S. Cl. .................... 165/185; 165/904; 165/905; 165/146
[58] Field of Search .................. 165/146, 185, 165/907, 904

[56] References Cited

U.S. PATENT DOCUMENTS

| | | | |
|---|---|---|---|
| 4,654,754 | 3/1987 | Daskowski | 165/185 X |
| 4,928,027 | 5/1990 | Deininger et al. | 310/11 |
| 5,174,368 | 12/1992 | Boury et al. | 165/146 |
| 5,366,688 | 11/1994 | Terpstra et al. | 419/36 |

*Primary Examiner*—Allen J. Flanigan
*Attorney, Agent, or Firm*—Davis and Bujold

[57] ABSTRACT

A radiator member for efficiently releasing heat to the surrounding area. Cordierite powder and copper powder are mixed in a base material of dimethyl silicone. Near one surface of the radiator member the mixture ratio of copper powder is increased, while in the opposite surface the mixture ratio of cordierite powder is increased. By bringing the surface of the radiator member, containing a larger ratio of copper powder in contact with a heat generating element, heat from the heat generating element can be quickly conducted through the highly conductive copper powder. The cordierite powder, which is heated by heat transmitted through the copper powder from the heat generating element, converts the heat into far infrared rays, and then releases the rays to the atmosphere. Heat is thus efficiently released to the surrounding area.

19 Claims, 1 Drawing Sheet

RADIATOR MEMBER

FIELD OF THE INVENTION

This invention relates to a radiator member for cooling electronic components or other heat generating components.

BACKGROUND OF THE INVENTION

Recently, integrated circuits (IC's) or other electronic components for use in electronic equipment or other devices have been increasingly integrated and operated at higher rates. This increases power consumption and heat output, and heat radiation has become an issue.

If such electronic components are overheated, their characteristics are varied, which results in the malfunction of electronic equipment or a breakdown of electronic components.

Conventionally, a radiative plate or heatsink is provided with electronic equipment or other devices, such that the electronic components are prevented from overheating during use. When the radiative plate is placed, for example, directly on an electronic component, heat generated by the component is transmitted to the plate. The radiative plate thus helps the electronic component discharge heat, and is typically formed of highly heat conductive material for this purpose. Heat transmitted to the radiative plate is released from the surface of the plate according to a difference in temperature between the surface of the radiative plate and the atmosphere.

Heat is transmitted from the electronic component to one surface of the radiative plate and is then quickly transmitted to the opposite surface of the radiative plate. However, the radiative plate has a limited ability to release heat to the surrounding area, and heat tends to be confined within the radiative plate.

To obtain sufficient heat radiation from the radiative plate, the surface area of the plate needs to be enlarged. Alternatively, the radiative plate needs to be provided with a forced cooling mechanism. As a result, electronic equipment composed of electronic components requiring such radiative plates cannot be miniaturized.

SUMMARY OF THE INVENTION

Wherefore, an object of the present invention is to provide a radiator member for efficiently radiating heat to the surrounding area.

To attain this and other objects, the invention provides a radiator member obtained by mixing a conductive material, having a high heat conductivity and a radiative material, having a high heat emissivity, and forming the mixed material into a specific configuration. The radiative material occupies a small ratio of the mixed material near one surface of the radiator member. The ratio of the radiative material in the mixed material is increased toward the opposite surface of the radiator member.

Heat from the heat generating element is quickly conducted by the heat conductive material of the radiator member. The conducted heat is then released to the surrounding area by the radiative material of the member.

A first surface of the radiator member, by which heat is received from the heat generating element, is formed of the mixed material with radiative material mixed therein at a smaller ratio. Without deteriorating the emissivity of the radiator member, heat is efficiently transmitted from the heating element to the first surface of the radiator member.

A second opposite surface of the radiator member is formed with a larger ratio of the radiative material, and is thus provided with a high emissivity. Therefore, the heat transmitted to the first surface of the radiator member can be efficiently released from the opposite surface thereof.

In the invention, heat from the heat generating element is transmitted to the radiator member, while heat transmitted to the radiator member is positively released. As compared with a conventional radiator member having a small emissivity, the radiator member of the invention can release heat more efficiently.

Even if the radiator member is smaller in size than a conventional member, it can provide the same radiative effectiveness. Therefore, the electronic equipment or other device with which the radiator member of the invention is used can be miniaturized.

For the highly heat conductive material, highly elastic carbon fiber; copper, aluminum, iron or other metallic powder; metallic fiber; ceramic; carbon black; or combination of these constituents can be used.

For the highly emissive material, various types of ceramic, graphite, or other material that is superior in radiating far infrared rays can be used. The ceramic may be alumina, zirconia, titania or other suitable material. Especially for a ceramic having a high emissivity of far infrared rays, a low thermal expansion coefficient and a high heat resistance, cordierite ($2MgO \cdot 2Al_2O_3 \cdot 5SiO_2$), β-spodumene ($LiO_2 \cdot Al_2O_3 \cdot 4SiO_2$), or aluminum titanate ($Al_2O_3 \cdot Ti_2O_3$) is preferably used. In addition, for a ceramic having a high emissivity in the entire infrared region, transition element oxide system ceramic (e.g. ceramic composed of 60% by weight of $MnO_2$, 20% by weight of $Fe_2O_3$, 10% by weight of CuO and 10% by weight of CoO) can be used.

As aforementioned, a radiative material providing superior radiation of far infrared rays is preferable. Specifically, the radiative material preferably radiates infrared rays in a temperature range from about 86° F.(30° C.) to about 248° F.(120° C.) at an emissivity of at least 0.8.

As a matrix material in which the radiative material and the heat conductive material are mixed, organopolysiloxane, polyamide, polyester, polyolefin or other thermoplastic homopolymer; thermoplastic elastomer, isoprene or other synthetic rubber or natural rubber; or copolymer or mixture of the mentioned constituents can be used. Alternatively, phenol resin or other thermosetting resin can be used.

BRIEF DESCRIPTION OF THE DRAWINGS

The invention will now be described, by way of example, with reference to the accompanying drawing, in which.

DETAILED DESCRIPTION OF THE PREFERRED EMBODIMENTS

Figure 1:
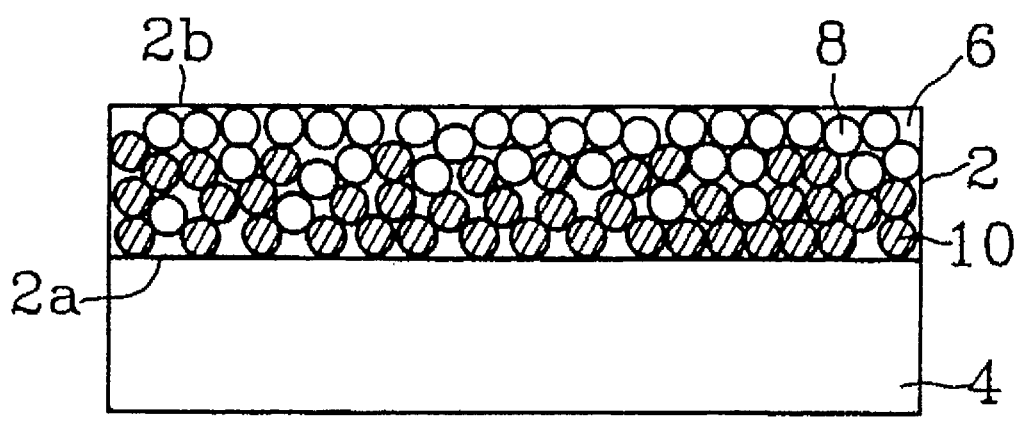
FIG. 1 is a cross-sectional view of a radiator member embodying the invention.

An embodiment of the invention will now be explained. FIG. 1 shows a cross section of a IC chip or other heat generating element 4 on which a radiator member 2 embodying the invention is placed.

As shown in FIG. 1, the radiator member 2 is placed in direct contact with the heat generating element 4, such that heat is released from the element 4. Highly emissive material (e.g. cordierite powder) 8 is mixed with highly conductive material (e.g. copper powder) 10 in a base material of dimethyl silicone 6. The mixed material is compressed in a body and is then formed into a sheet.

The mixed material in the vicinity of a heat conductive face 2a brought in contact with the heat generating element 4 has a larger ratio of copper powder 10 than cordierite powder 8. In the vicinity of an opposite heat radiative face 2b, a larger ratio of cordierite powder 8 is mixed in the material. In the region between faces 2a and 2b, the mixture ratio gradually changes from a large ratio of copper powder 10 at face 2a to a large ratio of cordierite powder 8 at face 2b.

In the radiator member 2, heat transmitted from the heat generating element 4 is quickly conducted though highly conductive copper powder 10. The cordierite powder 8, heated by the heat transmitted through the copper powder 10, converts the heat into far infrared rays, and radiates the rays to the surrounding area.

Since the radiator member 2 releases heat efficiently, the temperature of the heat generating element 4 is prevented from rising.

A method of manufacturing the radiator member 2 is now explained.

First, cordierite powder 8 having an average particle diameter of 35 µm, and/or copper powder 10 having an average particle diameter of 10 µm, and dimethyl silicone 6 are mixed and formed into three sheets, such that the sheets are formed of 40% by volume of the base material of dimethyl silicone 6 and 60% by volume of additives of cordierite powder 8 and/or copper powder 10. As shown in Table 1 sheet A is obtained by mixing only cordierite powder 8 in dimethyl silicone 6, sheet B is obtained by mixing both cordierite powder 8 and copper powder 10 in dimethyl silicone 6, and sheet C is obtained by mixing only copper powder 10 in dimethyl silicone 6.

TABLE 1

| SHEET | CONSTITUENT (% BY WEIGHT) | | |
|---|---|---|---|
| | CORDIERITE | COPPER | DIMETHYL SILICONE |
| A | 72 | 0 | 28 |
| B | 22 | 60 | 18 |
| C | 0 | 87 | 13 |

Sheets A, B and C are laminated in order to form a 9 mm thick lamination and the lamination is extended with a compression roller to form a 5 mm thick lamination.

Subsequently, the extended lamination is again extended with the compression roller heated to 212° F.(100° C.), thereby forming a 2 mm thick composite sheet.

The composite sheet is in turn compressed in a metallic mold, heated in a furnace at 338° F.(170° C.) for ten minutes, and vulcanized, thereby forming the radiative member 2 of this embodiment. The resulting radiative member 2 is about 1.5 mm thick. As shown in the cross-sectional view of FIG. 1, the mixture ratio of cordierite powder 8 and copper powder 10 is varied or gradient throughout the thickness of the member 2.

An experiment, which was conducted for evaluation of radiation of the aforementioned radiative member 2, is now explained.

In the experiment a radiative member, detailed later, was placed on the surface of an IC chip with transistor elements provided in parallel therein. While constant current was conducted to one transistor element and the other transistor element was operated, output voltage was measured. The temperature of the IC chip was calculated from the output voltage measurement.

For the experiment, the radiative member prepared by the aforementioned method was used as Embodiment 1. Using the same method, Embodiment 2 was prepared. In Embodiment 2, gas phase grown carbon fiber having a size of 0.1 µm×1 mm was used as the heat radiative material, and aluminum powder having an average particle diameter of 20 µm was used as the heat conductive material. These materials were mixed in dimethyl silicone 6, such that the resulting radiative member of Embodiment 2 was composed of 40% by volume of dimethyl silicone 6 and 60% by volume of carbon fiber and aluminum powder.

For the purpose of comparison, Reference 1 was prepared by mixing 60% by volume of copper powder 10, having an average particle diameter of 10 µm, in 40% by volume of dimethyl silicone 6, thereby forming a 1.5 mm thick heat radiative member. Furthermore, an IC chip with no radiative member was used as Reference 2.

The results are shown in Table 2.

TABLE 2

| | TEMPERATURE OF IC CHIP |
|---|---|
| EMBODIMENT 1 (CORDIERITE/COPPER POWDER) | 51° C. |
| EMBODIMENT 2 (CARBON FIBER/ALUMINUM POWDER) | 53° C. |
| REFERENCE 1 (COPPER POWDER) | 60° C. |
| REFERENCE 2 (NO RADIATIVE MEMBER) | 78 ° C. |

As shown in Table 2, when comparing Embodiments 1 with the conventional radiative member Reference 1, with no radiative material used therein, and with the IC chip Reference 2, having no radiative member, it was realized that the temperature of the IC chip provided with the radiative member of the embodiments of the present invention is lower than that of the reference chips.

In the aforementioned method of the embodiment, three sheets which are different from one another in the mixture ratio of radiative and conductive materials were laminated and compressed, thereby forming a three-laminate radiative member. Alternatively, the radiative member can be formed of two laminates or four or more laminates.

This invention has been described above with reference to the preferred embodiment as shown in the figures. Modifications and alterations may become apparent to one skilled in the art upon reading and understanding the specification. Despite the use of the embodiment for illustration purposes, the invention is intended to include all such modifications and alterations within the spirit and scope of the appended claims.

What is claimed is:

1. A heatsink, for releasing heat from a heat generating element, comprising:
   a heat conductive material;
   a heat radiative material mixed with said heat conductive material;
   a first layer of said heatsink having a relatively small ratio of said heat radiative material mixed with said heat conductive material; and
   a second layer of said heatsink having a relatively large ratio of said heat radiative material mixed with said heat conductive material; and
   said first and said second layers being laminated with one another to form a laminated heatsink structure.

2. A heatsink according to claim 1 whereby said ratio of said heat radiative material to said heat conductive material increases gradually from said first layer to said second layer.

3. A heatsink according to claim 1 whereby said second layer is opposite said first layer.

4. A heatsink according to claim 1 whereby said heat radiative material radiates infrared rays at an emissivity greater than 0.8 at a temperature range from about 30° C. to about 120° C.

5. A heatsink according to claim 1 whereby said first layer comprises substantially only said heat conductive material together with a base material and said second layer comprises substantially only said heat radiative material together with the base material.

6. A heatsink according to claim 5 wherein the base material is dimethyl silicone.

7. A heatsink according to claim 1 in combination with a heat generating element, wherein said first layer of said heatsink is placed in direct contact with an exterior surface of said heat generating element to facilitate transfer of heat from said heat generating element to said heatsink.

8. A combination according to claim 7 wherein said first layer of said heatsink is permanently secured to said exterior surface of said heat generating element.

9. A laminated heatsink, for releasing heat from a heat generating element, comprising:

a base material;

a heat conductive material mixed with said base material;

a heat radiative material mixed with said base material and said heat conductive material;

a first layer of said heatsink comprising said base material and having a relatively small amount of said heat radiative material relative to the amount of said heat conductive material;

a second layer of said heatsink comprising said base material and having a relatively small amount of said heat conductive material relative to the amount of heat radiative material; and an intermediate layer comprising said base material, said heat conductive material, and said heat radiative material; and said intermediate layer being located between and laminated with both said first and said second layers to form a laminated heatsink structure.

10. A heatsink according to claim 9, wherein said first layer comprises substantially only said heat conductive material and said base material.

11. A heatsink according to claim 9, wherein said second layer comprises substantially only said heat radiative material and said base material.

12. A heatsink according to claim 9 comprising:

said first layer consisting essentially of said base material and said heat conductive material;

said intermediate layer consisting essentially of said base material, said heat conductive material, and said heat radiative material; and said second layer consisting essentially of said base material and said heat radiative material.

13. A heatsink according to claim 12 wherein said laminate is formed by compressing said first, second, and third layers together.

14. A heatsink according to claim 9 in combination with a heat generating element, wherein said first layer of said heatsink is placed in direct contact with exterior surface of said heat generating element to facilitate transfer of heat from said heat generating element to said heatsink.

15. A combination according to claim 14 wherein said first layer of said heatsink is permanently secured to said exterior surface of said heat generating element.

16. A method of releasing heat from a heat generating element using a heatsink, said method comprising the steps of:

mixing a heat radiative material with a heat conductive material;

forming said mixture of said heat radiative material and said heat conductive material into a heatsink;

providing a first layer of said heatsink with a small ratio of said heat radiative material relative to said heat conductive material;

increasing the ratio of said heat radiative material to said heat conductive material gradually from said first layer to a second layer of said heatsink;

forming said first and said second layers into a laminated heatsink structure to provide the desired distribution of said heat conductive material and said heat radiative material; and placing said first layer of said heatsink in direct contact with said heat generating element.

17. A method according to claim 16 comprising the steps of mixing a base material with said heat radiative material and said heat conductive material.

18. A method according to claim 16 wherein the laminated structure is compressed to a desired thickness after formation.

19. A method according to claim 16 comprising the steps of compressing said laminated structure in a mold wherein the structure is heated and vulcanized.

\* \* \* \* \*